(12) United States Patent
Chung et al.

(10) Patent No.: US 8,476,949 B2
(45) Date of Patent: Jul. 2, 2013

(54) EDGE-TRIGGERED FLIP-FLOP DESIGN

(75) Inventors: Shine Chung, Sanchung (TW); Kenneth Chiakun Weng, Hsinchu (TW); Pin-Lin Chiu, Macungie, PA (US)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 1640 days.

(21) Appl. No.: 11/470,019

(22) Filed: Sep. 5, 2006

(65) Prior Publication Data

US 2008/0136481 A1      Jun. 12, 2008

Related U.S. Application Data

(63) Continuation of application No. 11/077,606, filed on Mar. 11, 2005, now abandoned.

(60) Provisional application No. 60/579,044, filed on Jun. 12, 2004.

(51) Int. Cl.
*H03B 1/00* (2006.01)
*H03K 3/00* (2006.01)

(52) U.S. Cl.
USPC .......................................... 327/208; 327/112

(58) Field of Classification Search
USPC .................. 327/202, 203, 201, 208, 210–212, 327/218, 108, 112, 333; 326/26, 27
See application file for complete search history.

(56) References Cited

U.S. PATENT DOCUMENTS

| | | | |
|---|---|---|---|
| 5,198,699 A * | 3/1993 | Hashimoto et al. | 327/108 |
| 6,501,315 B1 * | 12/2002 | Nguyen | 327/217 |
| 6,646,492 B2 * | 11/2003 | Park et al. | 327/530 |

* cited by examiner

*Primary Examiner* — Lincoln Donovan
*Assistant Examiner* — Diana J Cheng
(74) *Attorney, Agent, or Firm* — Duane Morris LLP

(57) ABSTRACT

An edge triggered flip-flop circuit is disclosed with a clock signal, an input signal, a switch module using the clock signal for defining a data passing window, and a latch module for receiving the input signal during the data passing window.

22 Claims, 15 Drawing Sheets

EDGE-TRIGGERED FLIP-FLOP DESIGN

CROSS REFERENCE

The present application is a continuation of U.S. application Ser. No. 11/077,606, filed on Mar. 11, 2005, which claims the benefits of U.S. Provisional Application No. 60/579,044, filed on Jun. 12, 2004, both of which applications are hereby incorporated by reference herein in their entireties.

BACKGROUND

The present disclosure relates generally to flip-flop designs, and more particularly to designs and methods that not only improve noise immunity but also reduce design space and power dissipation, thereby improving performance.

A flip-flop is an electronic circuit that stores a selected logical state in response to a clock pulse and one or more data input signals. Flip-flops are used in computational circuits. In these circuits, the flip-flops operate in selected sequences during recurring clock intervals to capture and hold certain data for a period of time sufficient for the other circuits within the system to further process that data. At each clock signal, data is stored in a set of flip-flops whose outputs are available to be applied as inputs to other combinatorial or sequential circuitry during successive clock signals. In this manner, sequential logic circuits are operated to capture, store and transfer data signals during successive clock signals.

Most flip-flops are designed to store data when a leading edge of a clock pulse is received, while some flip-flops store data on receipt of the trailing edge of a clock pulse. These flip-flops that store data at one of the aforesaid edges are known as single-edge-triggered flip-flops. Flip-flops that store data on both the leading edge and the trailing edge of a clock pulse are referred to as dual-edge-triggered flip-flops.

Electrical noise in either the data signal line or the clock line may cause the data signal to appear to change state at times other than at the rising or falling of the click signal, thereby causing bad data to be transferred and latched. One technique used to reduce the time of vulnerability is to generate a short duration pulse signal only as the clock signal rises or falls. However, the precision and repeatability required are too demanding. Another technique involves a master/slave mechanism. The second latch signal may be provided independently, but most typically, the original clock signal is inverted to provide a second rising latch signal as the original clock signal is falling. The first latch signal triggers a first pass gate, or the master, to transfer data to a first latch circuit for temporary storage. The second latch signal triggers a second pass gate, or the slave, to transfer data from the first latch circuit to a second latch circuit. This requires the construction of two latch circuits and their controls.

Many traditional designs of these circuits and their corresponding controls require more design space and more supply current. These designs are thus a liability in space- and power-conscious applications such as handheld devices. Therefore, desirable in the art of flip-flop designs are additional simpler designs that provide greater noise immunity with reduced design space.

Desirable in the art of semiconductor designs are additional switch designs that is faster, smaller, and consumes less electrical energy.

SUMMARY

In view of the foregoing, this disclosure provides circuits and methods to improve current flip-flop designs.

In a first example, a switch circuit is provided to generate a narrow clock pulse, within the duration of which a first data signal is passed and latched properly. In a second example, a data storage circuit is provided to ensure that the first data signal is temporarily stored before being passed onto a permanent latching mechanism.

The construction and method of operation of the invention, however, together with additional objects and advantages thereof will be best understood from the following description of specific embodiments when read in connection with the accompanying drawings.

DESCRIPTION

In the present disclosure, designs and methods of constructing flip-flop circuits are disclosed.

Figure 1:
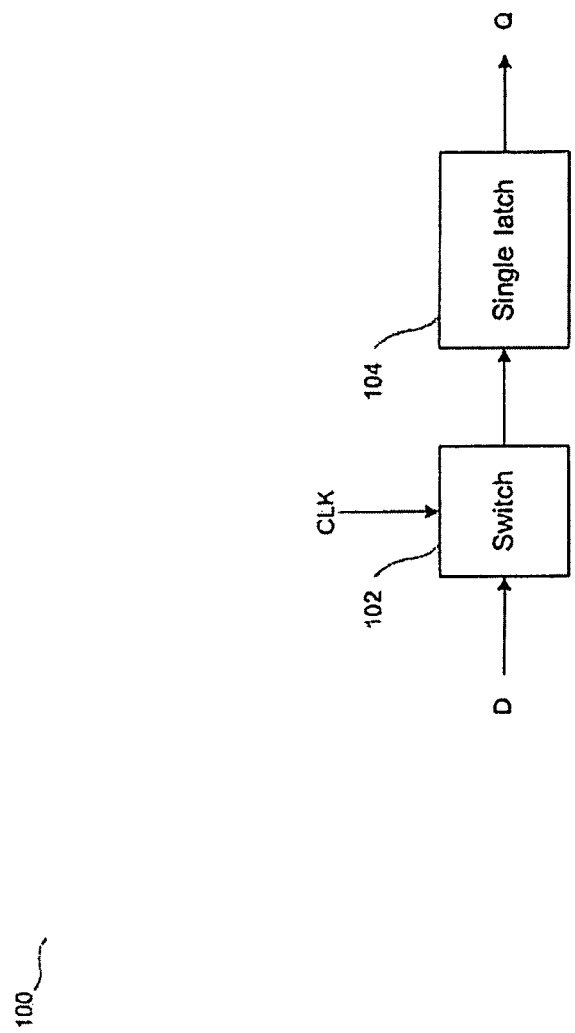
FIG. 1 presents a high-level design for an edge triggered flip-flop circuit in accordance with a first embodiment of the present invention.

FIG. 1 presents a high-level design for an edge triggered flip-flop 100 in accordance with a first embodiment of the present invention. A switch circuit 102 may include an inverter, a pass gate, a delay circuit, or a combination and plurality thereof. Other circuit elements may also be included to achieve its desired functionality. The switch circuit 102 is controlled by a clock signal CLK coming to a clock node (not shown). The switch circuit 102 controls the passage of data signal D coming to an input node (not shown), without intermediate storage. Data signal D passes from the switch circuit 102 to a single latch 104, where the data signal is stored. The stored data signal is read as data output Q.

Figure 2A:
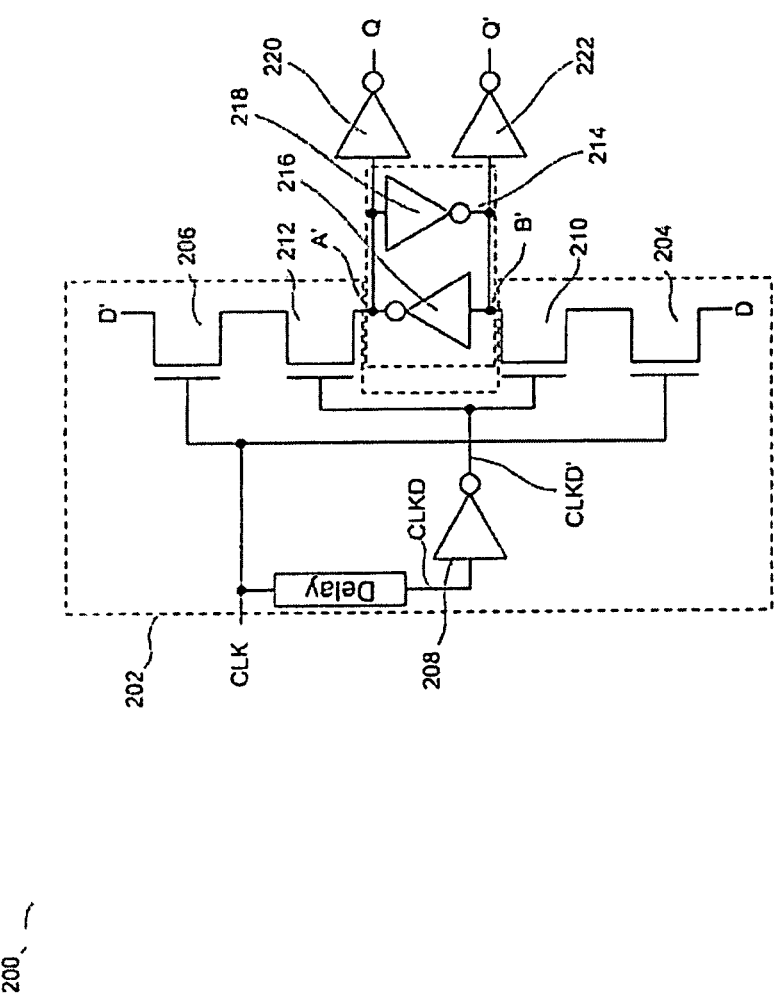
FIG. 2A illustrates detailed circuit elements of the flip-flop in accordance with the first embodiment of the present invention.

FIG. 2A illustrates a circuit 200 of the high-level design diagram 100 in accordance with the example of FIG. 1. A clock signal CLK enters a switch circuit 202 to control pass gates 204 and 206. The signal CLK also passes through a delay circuit to become a signal CLKD. The signal CLKD passes through an inverter 208 to become a signal CLKD', which is then used to control the pass gates 210 and 212. In other words, the signal CLKD' is essentially a delayed and inverted signal of the signal CLK. When the signal CLK goes high, the pass gate 204 is switched on, thereby allowing the passage of data signal D to the pass gate 210. Data signal D passes to a storage node B' of a latch 214 when both the signals CLK and CLKD' are high. Similarly, data signal D' is passed to a storage node A' of the latch 214 when both the clock signals CLK and CLKD' are high. Data signal D and D' are therefore passed, only during the brief time overlap of CLK and CLKD', into opposite sides of the latch 214, where the combination is stored as a single stable memory state. While the latch 214 is illustrated to be composed of two cross-coupled inverters 216 and 218, it is understood by those skilled in the art that latch design may vary, depending upon overall design requirements. Data output Q is read through an inverter 220, and data output Q' is read through an inverter 222.

Figure 2B:
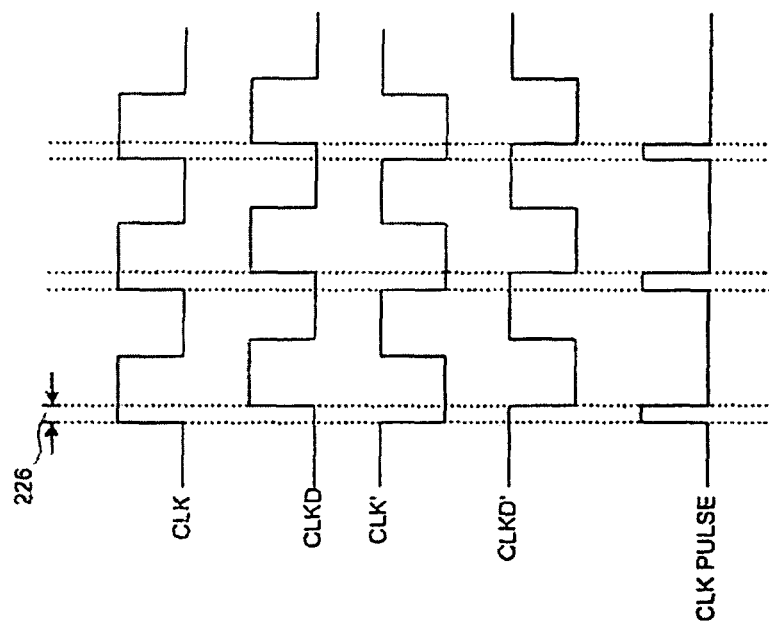
FIG. 2B presents a timing diagram for the flip-flop circuit in accordance with the first embodiment of the present invention.

FIG. 2B presents a timing diagram 224 for the high-level design 100 in accordance with the first embodiment of the present invention. The signal CLK enters the switch circuit 202 in FIG. 2A to directly control the pass gates 204 and 206. The signal CLK is also delayed, as indicated by the duration 226, by the delay circuit to produce the signal CLKD. The signal CLKD is then inverted by the inverter 208 to produce the signal CLKD' to control pass gates 210 and 212. As shown in FIG. 2B, signal CLKD' stays high for the duration 226 after the signal CLK has turned high. For that duration 226 only, both CLK and CLKD' are high. During that duration 226, all four pass gates are turned on and data signal D and D' pass all the way through all the pass gates to the latch 214. A triggering signal CLK PULSE represents a data passing window when the data signal is passed through all four gates to the latch. The duration 226, during which data signals pass, is a fraction of one half of a clock cycle. Therefore, the circuit 200 performs to read data signal D and D' into the latch 214 as an edge triggered flip-flop.

Figure 3:
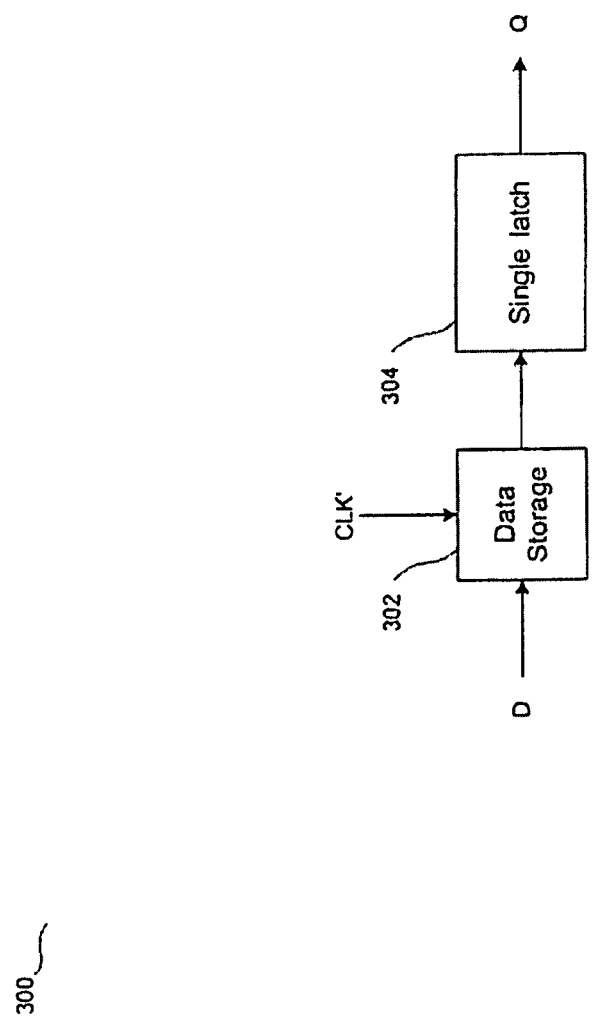
FIG. 3 presents a high-level design for an edge triggered flip-flop circuit in accordance with a second embodiment of the present invention.

FIG. 3 presents a high-level design diagram 300 in accordance with a second embodiment of the present invention. A data storage circuit 302 may include an inverter, a pass gate, a capacitor, a delay circuit, or a combination and plurality thereof. Other circuit elements may also be included to achieve its desired functionality. The data storage circuit 302 is controlled by a clock signal CLK'. The data storage circuit 302 controls the passage of data signal D by stepping data signal through the data storage circuit 302 to the single latch 304, where they are eventually stored. The stored data signals are read as data output Q.

Figure 4:
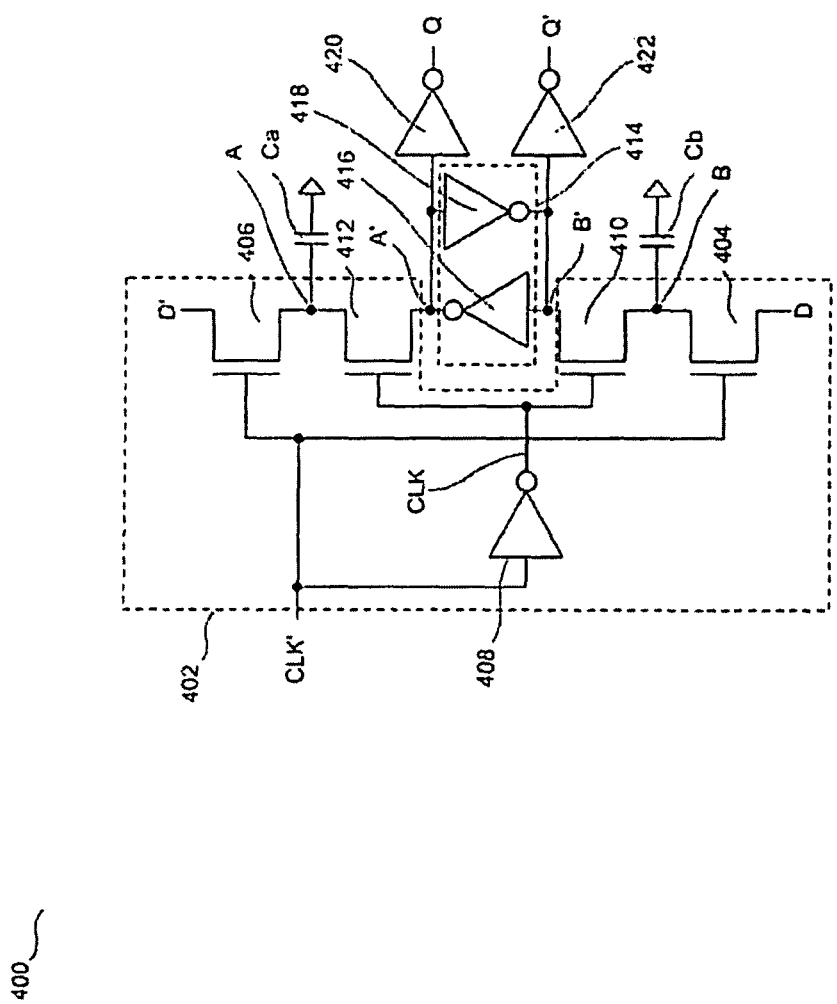
FIG. 4 illustrates detailed circuit elements of the flip-flop in accordance with the second embodiment of the present invention.

FIG. 4 illustrates a circuit 400 of the high-level design diagram 300 in accordance with the embodiment of FIG. 3. A signal CLK' enters a switch circuit 402 to control master pass gates 404 and 406. The signal CLK' also passes through an inverter 408 to become a signal CLK, which is then used to control the slave pass gates 410 and 412. The signal CLK' switches on the master pass gate 404 to allow passage of data signal D to a storage node B where data signal D is stored in a capacitor Cb. The signal CLK' also switches on the master pass gate 406 to allow passage of data signal D' to a storage node A where data signal D' is stored in a capacitor Ca. In the next half cycle of the clock signal, the signal CLK switches on the slave pass gate 410 to allow passage of the data signal D, from the capacitor Cb at the storage node B, to a storage node B' of a latch 414. The signal CLK also switches on the slave pass gate 412 to allow passage of the data signal D', from the capacitor Ca at the storage node A, to a storage node A' of the latch 414. Data signals D and D' are therefore sequentially stepped into opposite sides of the latch 414, where the combination is stored as a single stable memory state. As an example, the latch 414 is composed of inverters 416 and 418. Data outputs Q and Q' are read through the inverters 420 and 422, respectively.

Figure 5:
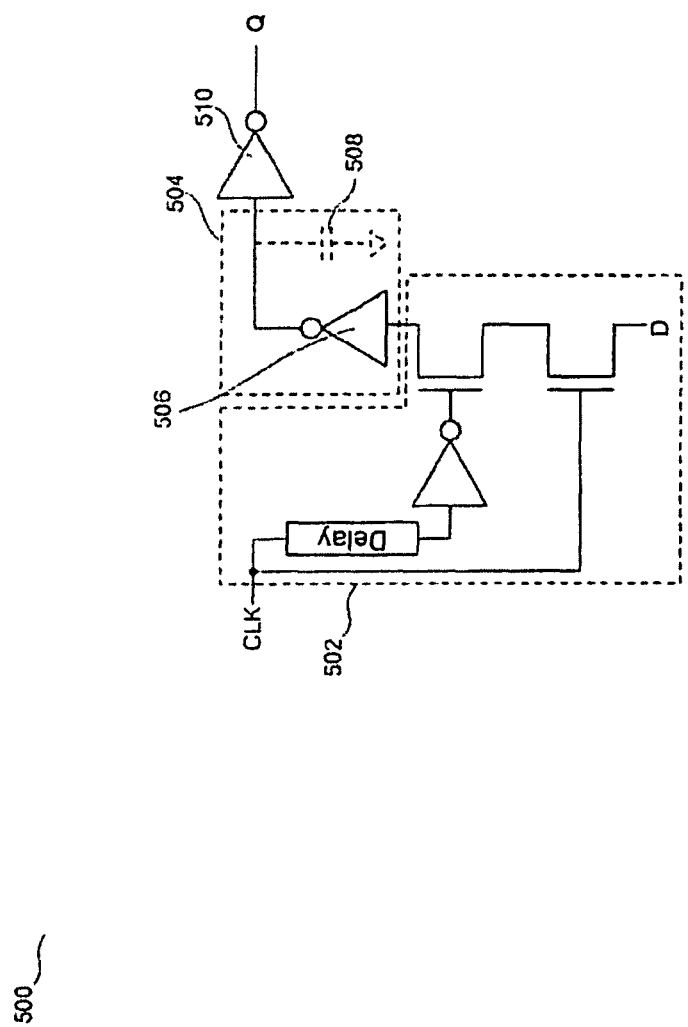
FIGS. 5 and 6 illustrate dynamic edge-triggering flip-flop circuits in accordance with other embodiments of the present invention.

FIG. 5 illustrates a dynamic edge-triggering circuit 500 in accordance with the third embodiment of the present invention. A switch circuit 502 is the same as the circuit 202 in FIG. 2A, but with only a single input for the data signal D. In a dynamic latch 504, there is only one inverter 506 and a capacitance module 508. This capacitance module 508 may be a parasitic structure that holds data temporarily. Data output Q is read through an inverter 510.

Figure 6:
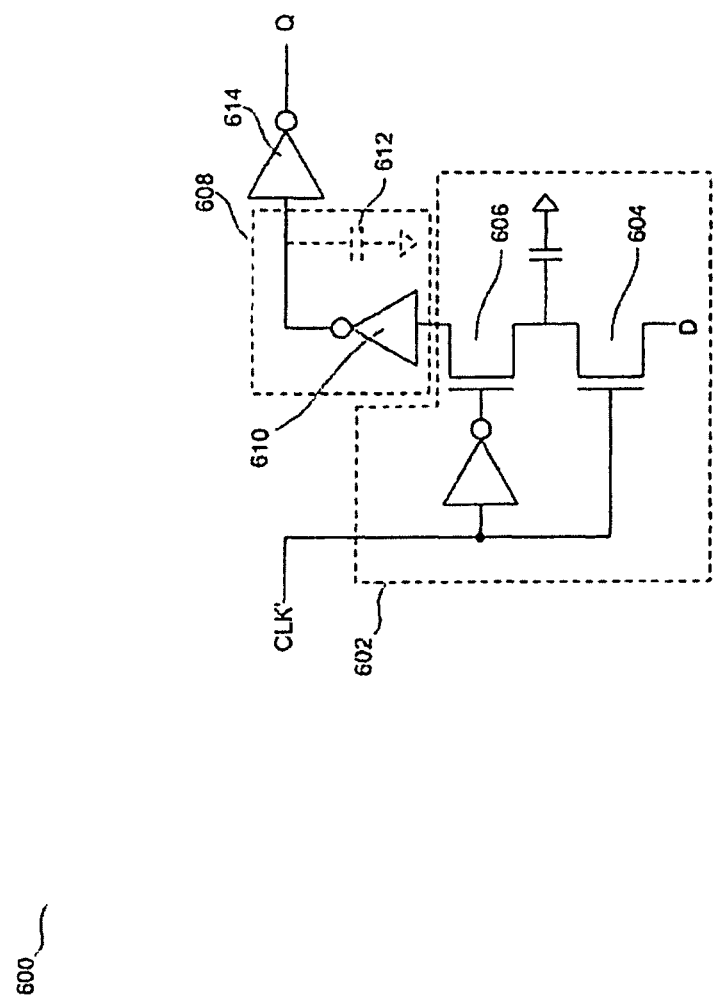

FIG. 6 illustrates a dynamic edge-triggering circuit 600 in accordance with the fourth embodiment of the present invention. A switch circuit 602 is the same as the circuit 402 in FIG. 4, except that only data signal D is passed, through a single master pass gate 604 and a slave pass gate 606. In a dynamic latch 608, there is only one inverter 610 and a capacitance module 612. This capacitance module 612 may be a parasitic structure that holds data temporarily. Data output Q is read through an inverter 614.

Figure 7:
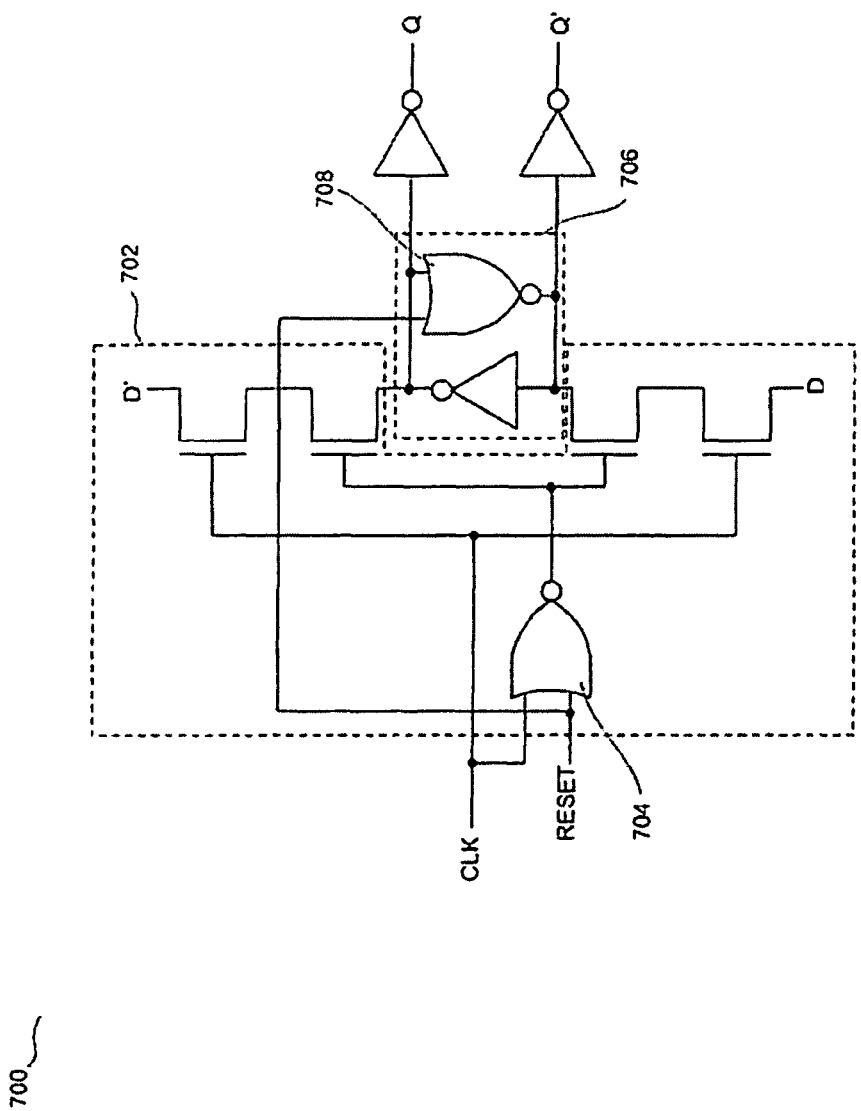
FIGS. 7 and 8 illustrate flip-flop circuits with reset and preset capabilities in accordance with embodiments of the present invention.

FIG. 7 illustrates a flip-flop circuit 700 with a reset option in accordance with the fifth embodiment of the present invention. The circuit 700 is similar to the circuit 200, except that the inverter 208 is replaced, in a switch circuit 702, with a NOR gate 704, one of whose inputs receives a reset signal RESET. In the latch 214, in FIG. 2A, the inverter 218 is replaced, in a latch 706, by a NOR gate 708, one of whose inputs receives the signal RESET. When the signal RESET (high) is applied to the circuit 700, the circuit 700 resets the data output Q to low.

Figure 8:
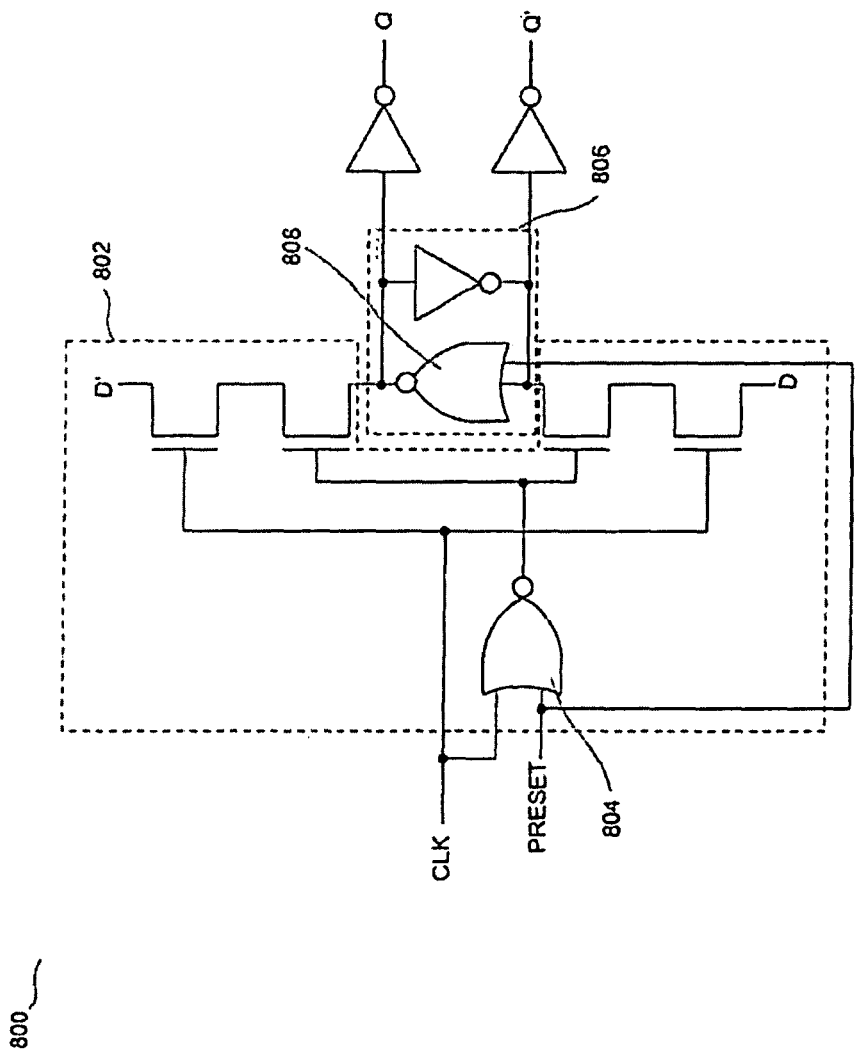

FIG. 8 illustrates a flip-flop circuit 800 with a preset option in accordance with the sixth embodiment of the present invention. The inverter 208 in FIG. 2A is replaced, in a switch 802 in FIG. 8, with a NOR gate 804, one of whose inputs receives a preset signal PRESET. In the latch 214, in FIG. 2A, the inverter 216 is replaced, in a latch 806, by a NOR gate 808, one of whose inputs receives the signal PRESET. When the signal PRESET (high) is applied to the circuit 800, the circuit 800 presets the data output Q to high.

Figure 9:
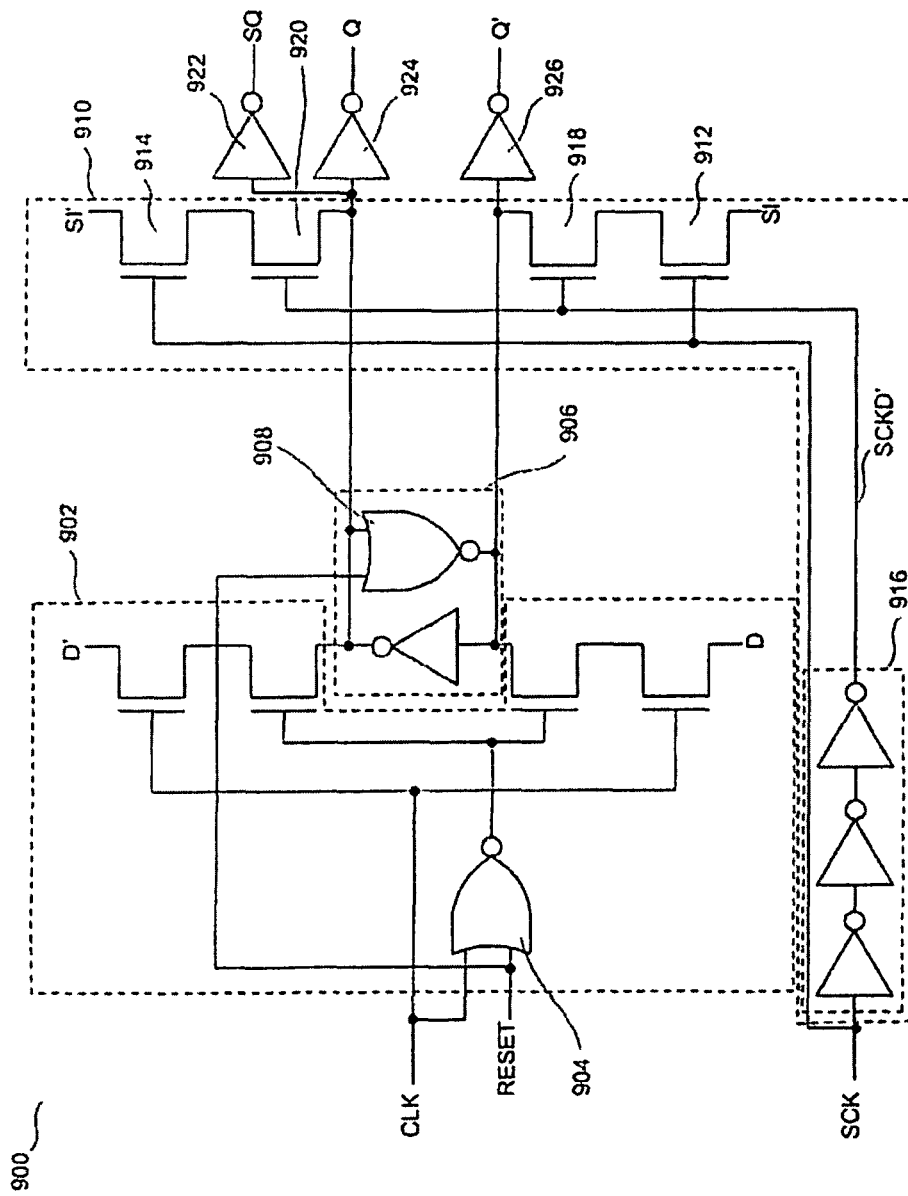
FIG. 9 illustrates a scannable flip-flop circuit in accordance with another embodiment of the present invention.

FIG. 9 illustrates a scannable circuit 900 with a reset option in accordance with an embodiment of the present invention. The circuit 900 is similar to the circuit 200, except for the following: the inverter 208 in FIG. 2A is replaced, in a switch circuit 902, by a first NOR gate 904, one of whose inputs receives a reset signal RESET. The inverter 218 in FIG. 2A is replaced, in a latch 906 in FIG. 9, by a second NOR gate 908, one of whose inputs receives the reset signal RESET. A scan clock signal SCK enters a scan switch 910, which is connected to the latch 906. The signal SCK is also connected to a pass gate 912, which controls the passage of a data input SI, and to a pass gate 914, which controls the passage of a data input SI'. The signal SCK is used, through a string of three inverters 916, to produce a signal SCKD', or a delayed and inverted equivalent of the signal SCK, which is used to control the pass gates 918 and 920. The uneven number of inverters provides an inverted signal of SCK with a predictable delay. Data outputs SQ and Q from SI' side and Q' from the SI side of the latch 906 are read through the inverters 922, 924, and 926 respectively.

Figure 10:
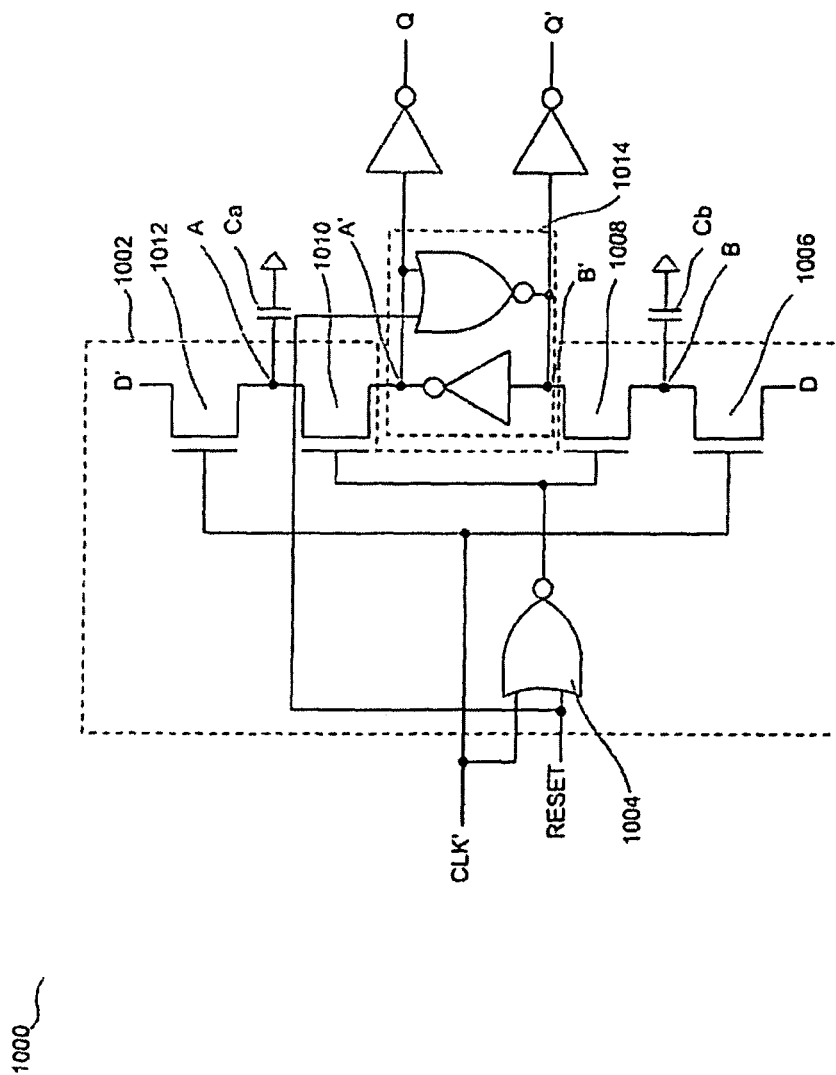
FIGS. 10 and 11 illustrate flip-flop circuits with reset and preset capabilities in accordance with other embodiments of the present invention.

FIG. 10 illustrates a flip-flop circuit 1000 with a reset option in accordance with another embodiment of the present invention. FIG. 10 is similar to FIG. 7, except for the following: signal CLK' replaces the signal CLK, while the delay circuit is omitted from the switch circuit 1002. A reset signal RESET is fed into a NOR gate 1004. In addition, a capacitor Cb is added at a storage node B between a master pass gate 1006 and a slave pass gate 1008, in the data signal D path. A capacitor Ca is added at a storage node A between a slave pass gate 1010 and a master pass gate 1012, in the data signal D' path. Storage nodes B' and A' determine the latched position of a latch 1014, while the signals RESET, Q and Q' provide the necessary inputs and outputs for the flip-flop circuit 1000.

Figure 11:
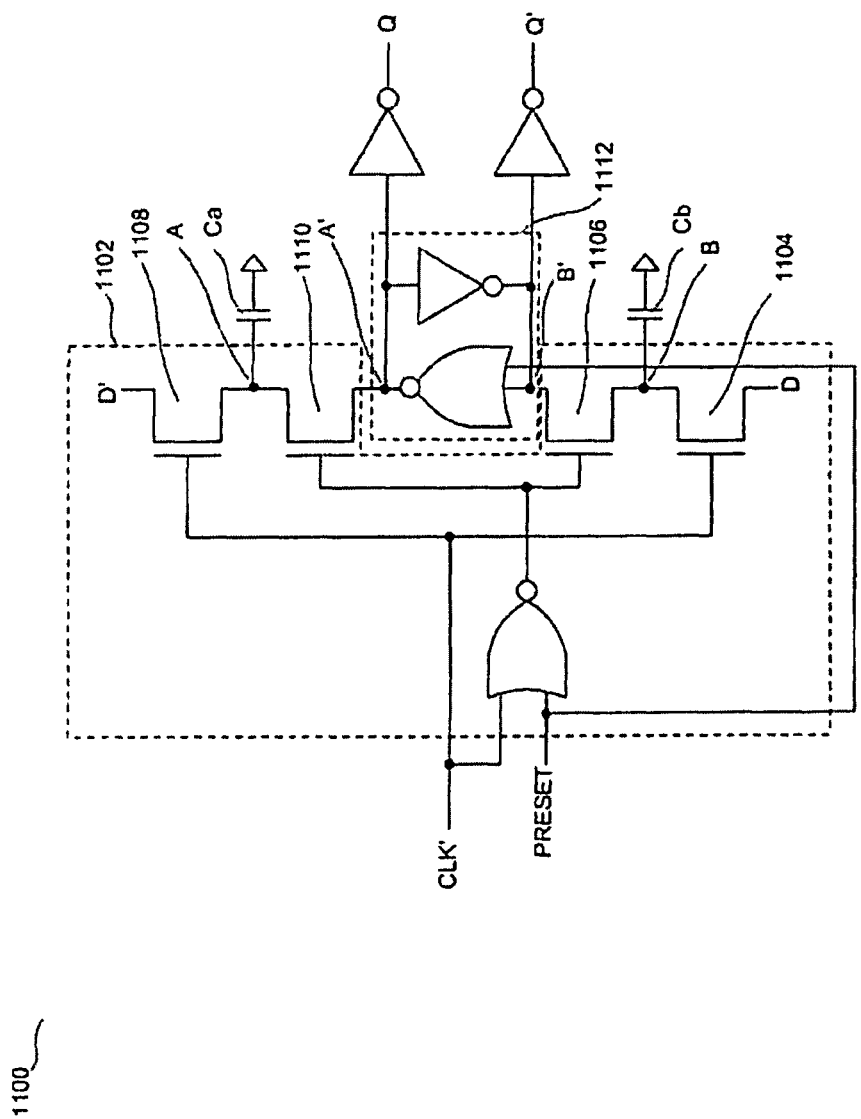

FIG. 11 illustrates a flip-flop circuit 1100 with a preset option in accordance with another embodiment of the present invention. FIG. 11 is similar to FIG. 8, except for the following: signal CLK' replaces the signal CLK, while the delay circuit is omitted from the switch circuit 1102. A capacitor Cb is added at a storage node B between a master pass gate 1104 and a slave pass gate 1106, in the data signal D path. A capacitor Ca is added at a storage node A between a master pass gate 1108 and a slave pass gate 1110, in the data signal D' path. Storage nodes B' and A' determine the latched position of a latch 1112, while the signals PRESET, Q and Q' provide the necessary inputs and outputs for the flip-flop circuit 1100.

Figure 12:
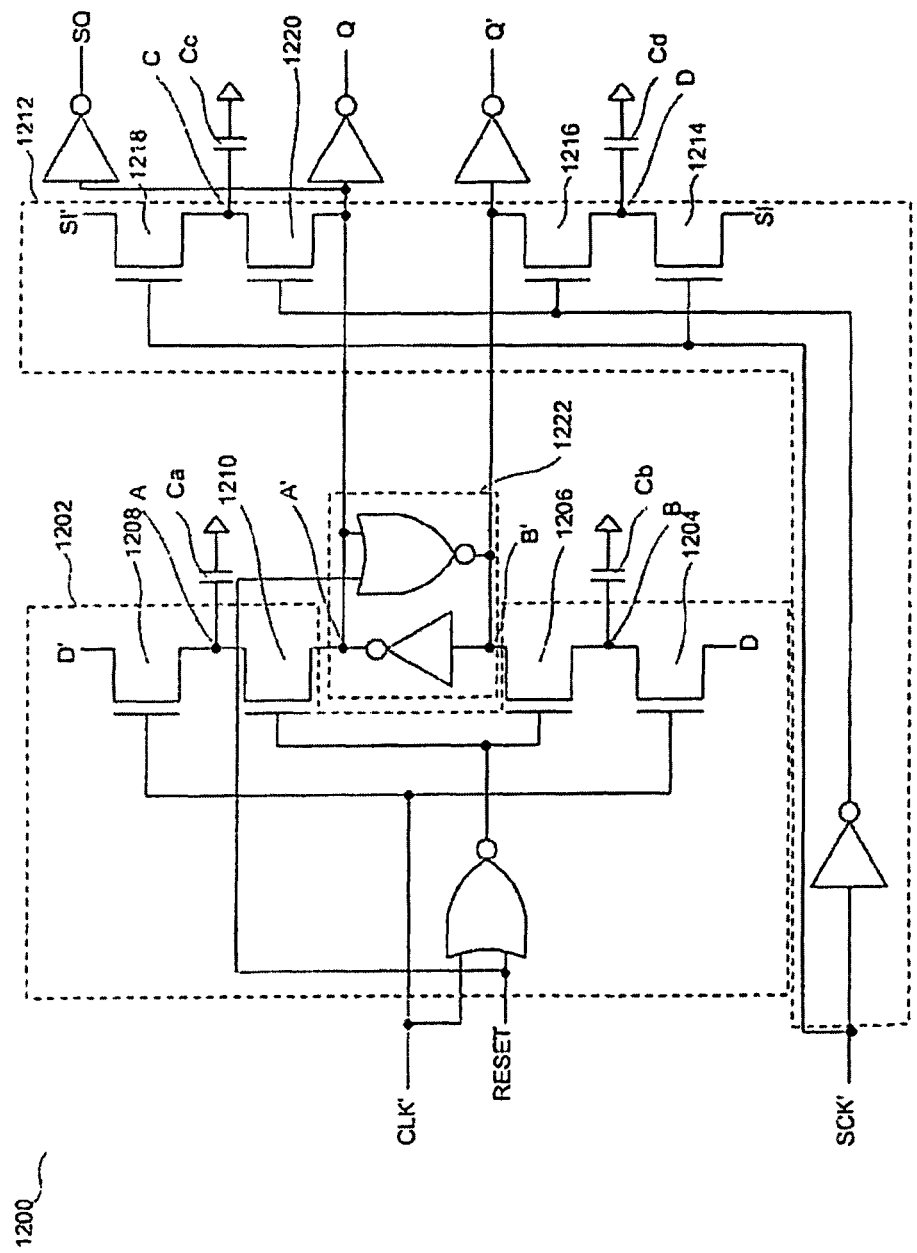
FIG. 12 illustrates a scannable flip-flop circuit in accordance with another embodiment of the present invention.

FIG. 12 illustrates a scannable circuit 1200 with a reset option in accordance with another embodiment of the present invention. FIG. 12 is similar to FIG. 9, except for the following: the input to a first switch circuit 1202 is the signal CLK' instead of the signal CLK, while the delay circuit is omitted from the first switch circuit 1202. Only one inverter is used instead of the three inverter string, as a delay, to provide the signal SCK, instead of the signal SCKD'. A capacitor Cb is added at a storage node B between a master pass gate 1204 and a slave pass gate 1206, in the data signal D path. A capacitor Ca is added at a storage node A between a master pass gate 1208 and a slave pass gate 1210, in the data signal D' path. The input signal to a second switch circuit 1212 is the signal SCK', which is an inverted equivalent of the signal SCK. An inverter, in an alternate path, inverts this back to the signal SCK. A capacitor Cd is added at a storage node D between a master pass gate 1214 and a slave pass gate 1216, in the scan input SI path. A capacitor Cc is added at a storage node C between a master pass gate 1218 and a slave pass gate 1220, in the scan input bar SI' path. The second switch circuit 1212 is connected to the same latch 1222 as is the first switch 1202. Storage nodes B' and A' determine the latched position of a latch 1222, while the signals RESET, SQ, Q and Q' provide the necessary inputs and outputs for the scannable circuit 1200.

Figure 13A:
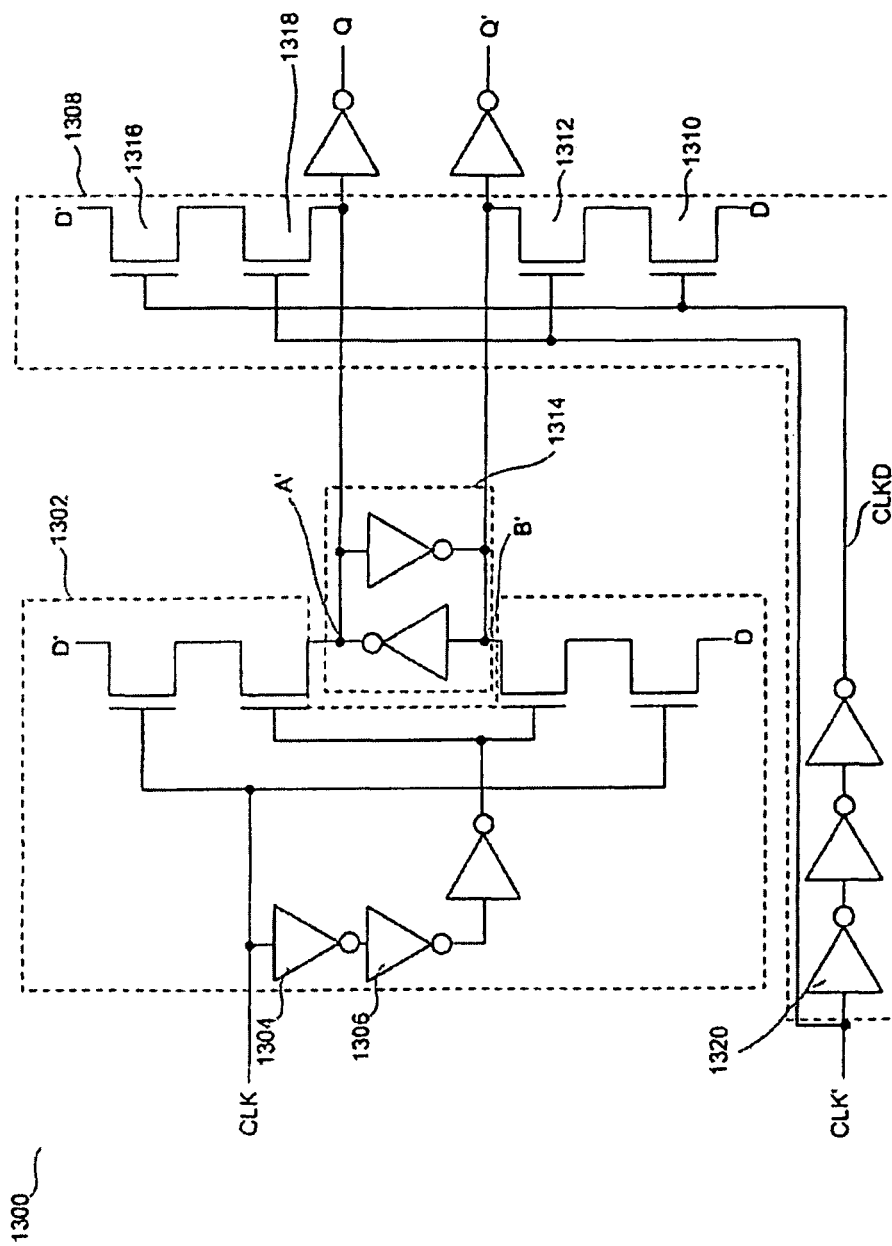
FIGS. 13A and 13B illustrate dual-edge-triggering circuits in accordance with two additional embodiments of the present invention.

FIG. 13A illustrates a dual-edge-triggering circuit 1300 in accordance with another embodiment of the present invention. FIG. 13A is similar to FIG. 2A, except for the following: instead of the delay circuit, a switch circuit 1302 includes two input inverters 1304 and 1306. A second switch circuit 1308, which is similar to the first switch circuit 1302, is added. The signal CLKD is used to control a pass gate 1310, which passes data signal D to a pass gate 1312, which in turn is controlled by the signal CLK'. The data signal D that passes both the pass gates 1310 and 1312 is stored at a node B' of a latch 1314. The signal CLKD is also connected to a pass gate 1316 to control the passage of data signal D' to the pass gate 1318, which in turn is controlled by the signal CLK' to further control the passage of the data signal D' to the storage node A' of the same latch 1314. The signal CLKD is generated by inverting the signal CLK' through three inverters, including the inverter 1320. The outputs remain the same.

Figure 13B:
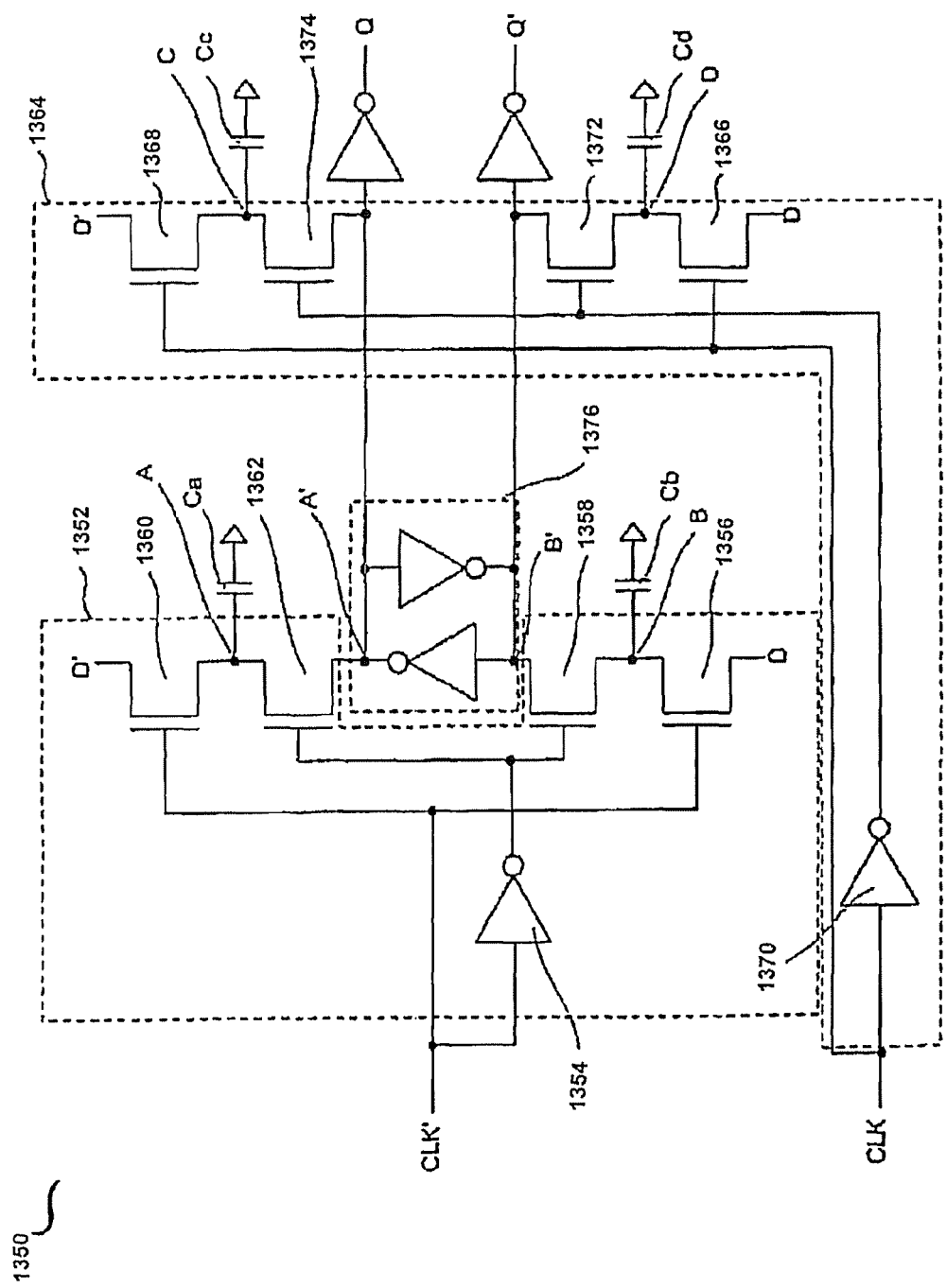

FIG. 13B illustrates a dual-edge-triggering circuit 1350 in accordance with another embodiment of the present invention. FIG. 13B is similar to FIG. 13A, except for the following: the input to the first switch circuit 1352 is signal CLK'. The string of three inverters is replaced by the inverter 1354. A capacitor Cb is added at a storage node B between the master pass gate 1356 and the slave pass gate 1358 in the data signal D path. A capacitor Ca is added at a storage node A between the master pass gate 1360 and the slave pass gate 1362 in the data signal D' path. The input to the second switch circuit 1364 is the signal CLK, which controls the master pass gates 1366 and 1368. The string of three inverters is removed and replaced by one inverter 1370, in an alternate path, whose output controls the slave pass gates 1372 and 1374. A capacitor Cd is added at a storage node D between the master pass gate 1366 and the slave pass gate 1372 in the data signal D path. A capacitor Cc is added at the storage node C between the master pass gate 1368 and the slave pass gate 1374 in the data signal D' path. Both the switch circuits 1352 and 1364 connect to the latch 1376 at the storage nodes B' and A'.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. An edge triggered flip-flop circuit comprising:
a clock node for receiving a clock signal;
an input node for receiving an input signal;
a switch module using the clock signal for defining a data passing window; and
a latch module for receiving the input signal during the data passing window,
wherein the switch module includes a pair of pass gates coupled in series between the input node and a data node of the latch module, the switch module further including a temporary storage device coupled to the pair of pass gates, a first one of the pass gates controlled by the clock signal and a second one of the pass gates controlled by an inverted clock signal, wherein the first pass gate is turned on to store the input signal to the temporary storage device and then the second pass gate is turned on to pass the stored input signal to the latch module, wherein the second pass gate shuts off at the end of the data passing window.

2. The circuit of claim 1 wherein the switch module further includes a second pair of pass gates coupled in series between a complementary input node and a second data node of the latch module and a temporary storage device for storing a complementary input signal coupled to the second pair of pass gates.

3. The circuit of claim 2 wherein the storage devices are capacitors.

4. The circuit of claim 1 wherein the storage device is a capacitance device.

5. The circuit of claim 1 further comprising a reset module for resetting an output to a predetermined value when a reset signal is activated.

6. The circuit of claim 1 further comprising a preset module for presetting an output to a predetermined value when a preset signal is activated.

7. The circuit of claim 1 further comprising a scan switch for producing a scanned output.

8. The circuit of claim 7 wherein the scan switch further includes a group of pass gates controlled by a scan clock and a delayed signal generated from the scan clock.

9. The circuit of claim 8 wherein the scan switch further includes one or more temporary storage device coupled to the pass gates for storing one or more scan inputs.

10. A dual edge triggering flip flop circuit comprising:
a clock node for receiving a clock signal;
an input node for receiving an input signal and a complementary input signal;
a first switch module using the clock signal for defining a first data passing window upon a first edge of the clock signal;
a latch module for storing the input signal during the first data passing window; and
a second switch module coupled to the latch module for generating an output within a second data passing window upon a second edge of the clock signal,
wherein each switch module includes:
a first set of pass gates for receiving the input signal and the complementary input signal,
a second set of pass gates coupled in series with the first set of pass gates in a master-slave configuration between the first set of pass gates and first and second data nodes of the latch module, and
a pair of temporary storage devices coupled to the first set of pass gates and the second set of pass gates, wherein the first set of pass gates is turned on to store the input signal and complementary input signal to the pair of temporary storage devices and then the second set of pass gates is turned on to pass the stored signals to the latch module, wherein the second set of pass gates shuts off at the end of the first or second data passing window respectively.

11. The circuit of claim 10 wherein the temporary storage devices are capacitive devices.

12. The circuit of claim 10 wherein the first set of pass gates is controlled by the clock signal and wherein the second set of pass gates is controlled by inversion thereto.

13. An edge triggered flip-flop circuit comprising:
a clock node for receiving a clock signal;
an input node for receiving an input signal;
a switch module using the clock signal for defining a data passing window; and
a latch module for receiving the input signal during the data passing window,
wherein the switch module further includes a pair of pass gates coupled in series between the input node and a data node of the latch module, the switch module further including a temporary storage device for storing the input signal, the pass gates being selectively controlled for storing the input signal to the temporary storage device and for creating the data passing window for passing the input signal to the latch module from the temporary storage device.

14. The circuit of claim 13 wherein the storage device is a capacitor.

15. The circuit of claim 13 further comprising a reset module for resetting an output to a predetermined value when a reset signal is activated.

16. The circuit of claim 13 further comprising a preset module for presetting an output to a predetermined value when a preset signal is activated.

17. The circuit of claim 13 further comprising a scan switch for producing a scanned output.

18. The circuit of claim 17 wherein the scan switch further includes a group of pass gates controlled by a scan clock and a delayed signal generated from the scan clock.

19. A dynamic edge-triggering circuit comprising:
a switch circuit with a master pass gate and a slave pass gate connected in series for receiving an input signal;
a first inverter for receiving the input signal passed from the switch circuit; and
a capacitance device coupled to an output of the first inverter,
wherein the switch module includes a storage device for storing the input signal after it passes the master pass gate,
wherein the master and slave pass gates are selectively controlled for storing the input signal to the storage device and for creating a data passing window for passing the input signal to the first inverter from the storage device.

20. The circuit of claim 19 wherein the master and slave pass gates are controlled by a clock signal and an inverted clock signal for creating the data passing window.

21. The circuit of claim 19 wherein the capacitance device is a parasitic capacitor.

22. The circuit of claim 19 further comprising a second inverter for delivering an output by inverting the output of the first inverter.

* * * * *